United States Patent
Clevenger et al.

(10) Patent No.: US 10,319,870 B2
(45) Date of Patent: Jun. 11, 2019

(54) PHOTOVOLTAIC MODULE WITH A CONTROLLABLE INFRARED PROTECTION LAYER

(75) Inventors: Lawrence A. Clevenger, Hopewell Junction, NY (US); Timothy J. Dalton, Yorktown Heights, NY (US); Maxime Darnon, White Plains, NY (US); Rainer Krause, Mainz (DE); Gerd Pfeiffer, Hopewell Junction, NY (US); Kevin Prettyman, Hopewell Junction, NY (US); Carl J. Radens, Hopewell Junction, NY (US); Brian C. Sapp, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1520 days.

(21) Appl. No.: 12/887,156

(22) Filed: Sep. 21, 2010

(65) Prior Publication Data

US 2011/0100420 A1    May 5, 2011

(30) Foreign Application Priority Data

Nov. 2, 2009  (EP) ..................... 09174791

(51) Int. Cl.
*H01L 31/00*  (2006.01)
*H01L 31/054*  (2014.01)
(Continued)

(52) U.S. Cl.
CPC ........ *H01L 31/0549* (2014.12); *G02B 26/007* (2013.01); *H01L 31/048* (2013.01);
(Continued)

(58) Field of Classification Search
CPC . H01L 31/0549; H01L 31/049; H01L 31/048; H01L 31/0488; G02B 26/007; Y02E 10/52
(Continued)

(56) References Cited

U.S. PATENT DOCUMENTS

| 5,449,413 A | 9/1995 | Beauchamp et al. |
| 6,441,299 B2 | 8/2002 | Otani et al. |

(Continued)

FOREIGN PATENT DOCUMENTS

| JP | 01177823 A | 7/1989 |
| JP | 02170579 A | 7/1990 |

(Continued)

OTHER PUBLICATIONS

Li,W.-S et al., Liquid crystals line up to make self-healing photovoltaic device, Innovations Report, Mar. 11, 2008, http://www.innovations-report.com/html/reports/energy_engineering/liquid_crystals_line_make_healing_photovoltaic_121475.html.

*Primary Examiner* — Thanh Truc Trinh
(74) *Attorney, Agent, or Firm* — Kunzler, PC; Bruce R. Needham

(57) ABSTRACT

An apparatus, system, and method are disclosed for a photovoltaic module, the photovoltaic module comprising a plurality of photovoltaic cells, a controllable infrared protection layer, and a protection switching means. The controllable infrared protection layer is for reducing the infrared radiation absorbed by the photovoltaic module, where the controllable infrared protection layer has a first state and a second state. When the infrared protection layer is in the first state the transmission of infrared radiation to the photovoltaic cells is higher than when the infrared protection layer is in the second state. The protection switching means is for
(Continued)

switching the controllable infrared protection layer between the first state and the second state.

9 Claims, 6 Drawing Sheets

(51) Int. Cl.
  *G02B 26/00* (2006.01)
  *H01L 31/048* (2014.01)
  *H01L 31/049* (2014.01)
(52) U.S. Cl.
  CPC ........ *H01L 31/049* (2014.12); *H01L 31/0488* (2013.01); *Y02E 10/52* (2013.01)
(58) Field of Classification Search
  USPC .................................................. 136/243–293
  See application file for complete search history.

(56) References Cited

U.S. PATENT DOCUMENTS

| | | | |
|---|---|---|---|
| 7,973,236 B2 * | 7/2011 | Sinsabaugh | ................... 136/246 |
| 2006/0234038 A1 | 10/2006 | Kernander et al. | |
| 2007/0017567 A1 | 1/2007 | Gronet et al. | |
| 2007/0154704 A1 | 7/2007 | Debergalis et al. | |
| 2008/0087321 A1 * | 4/2008 | Schwartzman | ............... 136/246 |
| 2008/0105302 A1 * | 5/2008 | Lu et al. | ...................... 136/258 |
| 2009/0032098 A1 | 2/2009 | Lu | |
| 2009/0139567 A1 | 6/2009 | Liu et al. | |
| 2009/0211631 A1 | 8/2009 | Temchenko et al. | |

FOREIGN PATENT DOCUMENTS

| | | | | |
|---|---|---|---|---|
| JP | 10-80167 | * | 3/1998 | ............... H02N 6/00 |
| WO | WO 2008/155767 | * | 12/2008 | |

* cited by examiner

PHOTOVOLTAIC MODULE WITH A CONTROLLABLE INFRARED PROTECTION LAYER

CROSS-REFERENCE TO RELATED APPLICATIONS

This application claims priority to European Patent Application Number EP09174791 entitled "PHOTOVOLTAIC MODULE WITH A CONTROLLABLE INFRARED PROTECTION LAYER" and filed on Nov. 2, 2009 for Lawrence A. Clevenger, et al. which is incorporated herein by reference.

FIELD

The subject matter disclosed herein relates to photovoltaic modules, in particular it relates to photovoltaic modules with a controllable infrared protection layer.

BACKGROUND

Photovoltaic modules use a plurality of photovoltaic cells to produce electricity using the photovoltaic effect. Photovoltaic cells may be manufactured in a variety of ways, however the use of semiconductor wafers to manufacture photovoltaic cells or the use of thin semiconductor films deposited upon a substrate are common methods of manufacturing photovoltaic modules. The use of silicon for the semiconductor is also very common.

A difficulty that many types of photovoltaic modules have is that as the temperature of the photovoltaic module increases its efficiency decreases.

BRIEF SUMMARY

The invention provides for a photovoltaic module, a photovoltaic module system, a computer program product, and a method of operating a photovoltaic module system in the independent claims. Embodiments are given in the dependent claims.

The infrared and ultraviolet parts of sunlight may cause heating for solar energy device operation. The elevated temperature generated by infrared and ultraviolet exposure causes efficiency degradation which can be quite substantial. In addition, infrared and ultraviolet radiation does not generate significant carriers for generation of electricity using the photovoltaic effect.

Embodiments of the invention address this problem by providing a means for preventing device heating through infrared radiation and/or ultraviolet radiation. In an embodiment, a top substrate glass is covered with a specific polymer layer that reflects infrared radiation. This layer may contain cholesteric liquid crystals. When these crystals are aligned in a certain manner efficiently reflect infrared radiation. In case of ultraviolet radiation the protection layer may be a conventional ultraviolet reflector, similar to the one used in cars or sun glasses.

This approach has the advantage that the photovoltaic device operates at low ambient temperature with maximum efficiency. Also a generic maintenance support feature may be included to run photovoltaic modules more efficiently and reliably.

Photovoltaic modules do see various other degradations over time, which may be caused for example, but are not limited to, temperature, mechanical stress, and contamination. Individual cells within the module may degrade more than others, causing a cell miss-matching within the module. Other maintenance issues are partial module shadowing by e.g. leafs on the surface or shading by trees.

Applying efficient monitoring and maintenance may help to increase and maximize the photovoltaic module output as well as life time of the photovoltaic module.

Embodiments of the invention discussed below may contain photovoltaic module monitoring features, down to cell level, as well as appropriate maintenance activities to secure best output performance.

The invention discussed below is an advanced maintenance solution to monitor installed photovoltaic modules and initiate maintenance activities in case required. Maintenance might be required by causes like shadowing of the module surface through contamination, leafs, shadowing objects, haze and storm damages etc. Also module and/or cell degradation over time is an issue and might require a maintenance activity. To activate maintenance the base requirement is to generate performance data which are monitored over time. Based on evaluated data trends the decision for maintenance must be made.

Embodiments of the invention may have the following benefits:
 Increased efficiency and power output of photovoltaic devices.
 Easy to place the polymer layer on top or below the upper glass substrate.
 Reduced aging and degradation of the photovoltaic device due to lower operational temperature.
 Photovoltaic modules can be monitored and self healing maintenance may be initiated.
 The power output of the module can be optimized and maximized.

The invention provides for a photovoltaic module. The photovoltaic module comprises a plurality of photovoltaic cells. The photovoltaic module further comprises a controllable infrared protection layer for reducing infrared radiation absorbed by the photovoltaic module. The controllable infrared protection layer has a first state and a second state. When the infrared protection layer is in the first state the transmission of infrared radiation to the photovoltaic cells is higher than when the infrared protection layer is in the second state.

The photovoltaic module further comprises a protection switching means for switching the controllable infrared protection layer between the first state and the second state. A photovoltaic cell as used herein is a device that converts light into electricity using the photovoltaic effect. Photovoltaic cells may be manufactured from a semiconductor wafer such as a silicon wafer. Photovoltaic cells may also be manufactured using thin film technology. When photovoltaic cells are manufactured using thin film technology thin films of semiconductor may be deposited upon a substrate. Using this process a plurality of individual photovoltaic cells may be manufactured on the substrate.

Embodiments of this photovoltaic module are advantageous because the infrared protection layer can be used to reduce the amount of infrared radiation absorbed by the plurality of photovoltaic cells. Reducing the amount of infrared radiation which is incident on the photovoltaic cells is advantageous, because infrared radiation only leads to heating of the photovoltaic cells. The infrared radiation does not have enough energy to cause the generation of electricity in a photovoltaic cell. Having an infrared protection layer being able to switch between the first state and the second state is advantageous because the infrared protection layer may reduce the efficiency of the photovoltaic cell.

However, as the temperature of a photovoltaic cell increases the efficiency of the photovoltaic cell decreases. That is, the amount of electricity generated by incident light is reduced as the temperature of the photovoltaic cell increases. There is therefore a point where switching the infrared protection layer to the second state is beneficial because it will result in the reduction in temperature of the photovoltaic cells such that it is sufficient to overcome the efficiency lost when the infrared protection layer is in the second state. The infrared protection layer can be implemented in a variety of ways. A mechanical system could be used to extend or retract the infrared protection layer over the photovoltaic module. In this case the protection switching means would be a mechanism that is able to move the infrared protection layer between the first state and the second state. Alternatively the infrared protection layer may be integrated into the photovoltaic module such that it is always in place and is simply activated when the infrared protection layer is placed in the second state.

In another embodiment, the control of a protection layer comprises a protective infrared foil. In the second state, the protective foil covers the plurality of photovoltaic cells. In the first state the protective foil does not cover the photovoltaic cells. The protection switching means comprises a rolling mechanism adapted for moving the protective foil between the first state and the second state. This embodiment is advantageous, because the rolling mechanism and protective infrared foil can be added to existing photovoltaic modules. Additionally, if the protective infrared foil deteriorates over time or becomes weathered due to being exposed to sunshine and rain, the protective foil and/or the rolling mechanism can be replaced.

In another embodiment the photovoltaic module has a front side and a backside. The photovoltaic module produces electricity when the front side is illuminated. The individual photovoltaic cells which make up the plurality of photovoltaic cells are producing electricity using the photovoltaic effect. The photovoltaic module further comprises a glass substrate which protects the front side of the photovoltaic module. The photovoltaic module further comprises a polymer layer with reflective liquid crystals. The reflective liquid crystals may be cholesteric liquid crystals to reflect the infrared radiation. The polymer layer comprises a top electrode and a bottom electrode. Either the top electrode or the bottom electrode is adjacent to the glass substrate.

The protection switching means comprises a voltage supply adapted for applying a switching voltage to the top electrode and the bottom electrode. The controllable infrared protection means in the first state when the top electrode and the bottom electrode are at the same potential. The controllable infrared protection means is in the second state when the switching voltage is applied across the top electrode and the bottom electrode. Reflective liquid crystals in the polymer with reflective liquid crystals are reflective in the infrared wavelength. In the first state a voltage is not applied across the front electrode and the bottom electrode. In this state the liquid crystals have a random arrangement. When the voltage is applied across the front electrode and the bottom electrode the liquid crystals become aligned. When this happens, the reflectivity of the liquid crystals with respect to light in the infrared wavelength increases and the infrared radiation which is able to reach the photovoltaic modules is decreased. Light passes through the polymer layer, so the front electrode and bottom electrode are preferably transparent to light in a frequency range which is used for generating electricity using a plurality of photovoltaic cells. The construction of transparent electrodes is well known from the display and flat television industries. For instance indium tin oxide or ITO may be used to construct such electrodes.

In another embodiment the controllable infrared protection layer comprises an ultraviolet reflector. This embodiment is advantageous, because ultraviolet light also contributes to heating of the photovoltaic modules. By reflecting the ultraviolet light the temperature at which the photovoltaic modules operate at may be reduced. The infrared protection layer may be incorporated into the infrared protection layer. For instance in a situation where the infrared protection layer is mechanically moved between the first state and the second state the ultraviolet reflector may also be moved at the same time if it is incorporated into the controllable infrared protection layer. Alternatively the ultraviolet reflector may be permanently integrated into the photovoltaic module. For instance an ultraviolet reflecting layer may be deposited on the surface of a glass layer which is used to protect the photovoltaic modules.

A variety of materials may be use for the ultraviolet reflector. Acetyl acetone (AcAc) chelated silanes and 3-glycidoxypropyl-trimethoxysilane (GPTMS) modified nanotitania sols may be used for the ultraviolet-protective hard coating materials by the sol-gel technique.

Methacrylate functionalized silanes and nanoscaled boehmite particles may be used for the preparation of the ultraviolet curable hard coatings by the sol-gel technique may also be used as the ultraviolet reflector. The inorganic network is formed as a result of the controlled hydrolysis and condensation of the methacryloxysilanes in the presence of nanoparticles.

Ultrafine particles of titanium dioxide (TiO2) may also be used to scatter ultraviolet radiation. For example, transparent TiO2 may be used for ultraviolet-protection. It has been known for some time that window glass filters out UVB and transmits UVA and visible light. Recent developments in the glass industry have resulted in glass that provides broad ultraviolet protection without the historically associated loss of visible light transmission. Factors affecting ultraviolet-protective properties of glass are glass type, glass color, interleave between glass, and glass coating.

Transparent film made from PET and PEN also offer good ultraviolet-protection. The polyester film may contain polyethylene terephthalate as a main constituent and 2-20 weight % of polyethylene naphthalate. The thickness of the film may be 4-23 micrometers, and the number of pinholes per 100 m2 of the film may be less than 30.

In another embodiment the photovoltaic module further comprises a temperature sensor. The temperature sensor measures a module temperature representative of the temperature of the plurality of photovoltaic cells. The protection switching means is adapted for switching the controllable infrared protection layer from the first state to the second state when the module exceeds a predetermined temperature threshold. This embodiment is advantageous, because the temperature of the photovoltaic module can be monitored correctly. In this way the controllable infrared protection layer can be moved between the first state and the second state so as to maximize the efficiency of the photovoltaic module.

In another embodiment the protection switching means comprises a thermal expansion element. The temperature of the thermal expansion element switches the controlled infrared protection layer between the first state and the second state. This may be implemented in several different ways. For instance the protection switching means may be an electrical switch which either closes or opens at the predetermined temperature threshold. Alternatively, a mechanism may have a thermal expansion element which, as it expands or contracts due to the temperature, moves or controls a mechanism which moves the controllable infrared protection layer between the first state and the second state. This embodiment is advantageous because it eliminates the need for a complicated control system.

In another embodiment when the infrared protection layer is in the first state the transmission of visible light to the plurality of photovoltaic cells is higher than when the infrared protection layer is in the second state.

In another aspect the invention provides for a photovoltaic module system. The photovoltaic module system comprises a photovoltaic module according to an embodiment of the invention. The photovoltaic module further comprises a temperature sensor. The temperature sensor measures a module temperature representative of the temperature of the plurality of photovoltaic cells.

The photovoltaic module system further comprises a control system adapted for receiving the module temperature measurement. The control system is further adapted for signaling the protection switching means when the module temperature exceeds a predetermined threshold. The protection switching means is adapted for switching the controllable infrared protection layer from the first state to the second state when the module temperature exceeds a predetermined threshold. The photovoltaic module incorporates a temperature sensor and the control system is able to monitor the temperature of the photovoltaic module using the measurement of the temperature. The control system is then able to control the switching means and signal it to switch between the first state and the second state. The control system may be implemented as a mechanical thermostat or control system.

However, the control system may also be implemented electronically in the form of a microcontroller, a computer, a computer system, or an embedded system. The use of a controller that is electronically based or is a computer allows complicated algorithms to optimize the switching between the first state and the second state. This allows for more efficient generation of electricity using the photovoltaic module.

In another embodiment the photovoltaic module further comprises a power meter adapted for measuring the production of electricity by the photovoltaic module. The control system is adapted for calculating a maintenance schedule based on the measurement of the production of electricity. This embodiment is advantageous, because the calculation of a maintenance schedule is beneficial to the efficient operation of a photovoltaic module. For instance the control system could signal to an operator or a computer system belonging to a service providing company when the photovoltaic module needs to be serviced. The maintenance schedule could also contain information which can be used by the photovoltaic module system to perform self-maintenance.

In another embodiment the photovoltaic module system further comprises an infrared absorber. The infrared absorber is adapted for moving between a stored position and a deployed position. The infrared absorber is adapted for heating the photovoltaic module using absorbed infrared radiation when in the deployed position. The control system is adapted for signaling the infrared absorber to move between the stored position and the deployed position based upon the maintenance schedule. This embodiment is particularly advantageous, because with use the efficiency of photovoltaic modules may decrease. This is particularly true for photovoltaic modules which are manufactured using thin film technology. The efficiency of thin film photovoltaic modules can be restored by heating them or elevating its temperature for a period of time. By placing the infrared absorber in the deployed position, sunlight can be used to heat the photovoltaic module of the photovoltaic module system. The maintenance schedule can therefore be used to perform the heating of the module to increase the efficiency.

A variety of materials may be used as an infrared absorber. The spectra of the perovskite titanates, $SrTiO_3$, $PbTiO_3$, and $CaTiO_3$, and the perovskite niobates, $KNbO_3$ and $NaNbO_3$, have been found to be similar, in general features, to that of $BaTiO_3$.

Very efficient absorbers of infrared are highly porous metallic films deposited by thermal evaporation in nitrogen.

Infrared absorption can also be easy realized by using black colored surfaces or paint. For example a black, metallic surface may be used. This may be realized by a roll able, flexible foil with metalized surface.

In another aspect the invention provides for a computer program product for execution by a control system for controlling a photovoltaic module system according to an embodiment of the invention. The computer program product comprises machine executable instructions for performing the steps of monitoring the module temperature. The machine executable instructions further comprise instructions for performing the step of determining if the module temperature measurement exceeds a predetermined threshold. The machine executable instructions further comprise performing the step of signaling the protection switching means when the module temperature measurement exceeds a predetermined threshold. This computer program product monitors the temperature of the photovoltaic module and if the temperature of the photovoltaic module exceeds the predetermined threshold then the protection switching means is signaled by the controller to engage the controllable infrared protection layer by switching it into the second state.

In another embodiment the computer program product further comprises the steps of monitoring the production of electricity by the photovoltaic module. The machine executable instructions further comprise the step of calculating a maintenance schedule based on the measurement of the production of electricity. The benefit of this embodiment has been previously discussed.

In another embodiment the computer program product further comprises machine executable instructions for performing the step of signaling the infrared absorber to move between the stored position and deploy position based upon the maintenance schedule. The advantages of this embodiment have been previously discussed.

In another aspect the invention provides for a method of operating a photovoltaic module system according to an embodiment of the invention. The method comprises the step of monitoring the module temperature. The method further comprises the step of determining if the module temperature measurement exceeds a predetermined temperature threshold. The method further comprises the step of signaling the protection switching means when the module temperature measurement exceeds the predetermined temperature threshold.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
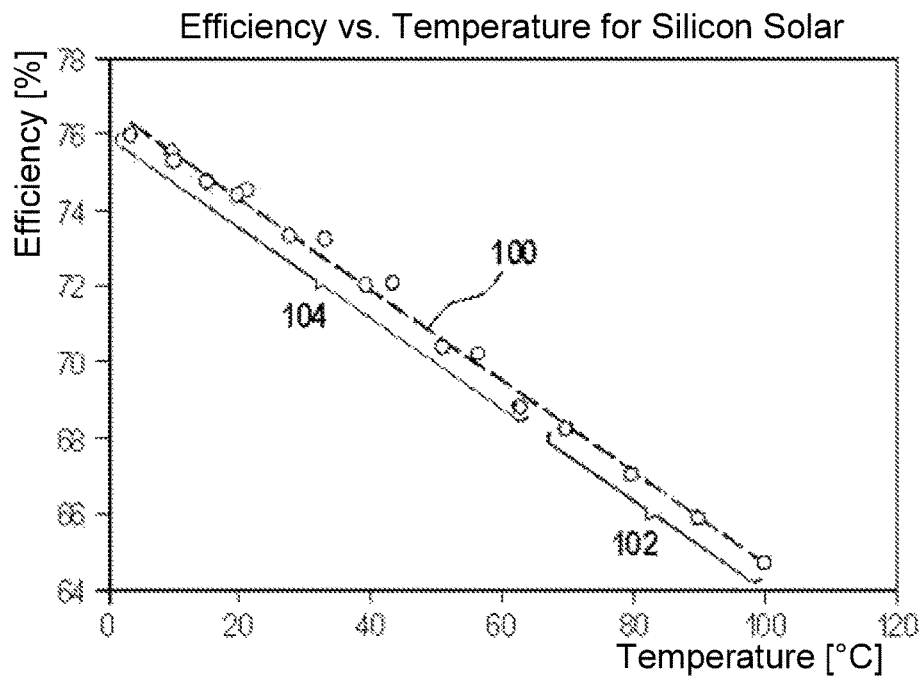
FIG. 1 illustrates the efficiency of a silicon photovoltaic cell as a function of temperature.

As will be appreciated by one skilled in the art, aspects of the present invention may be embodied as an apparatus, a system, method or computer program product. Accordingly, aspects of the present invention may take the form of an entirely hardware embodiment or an embodiment combining software (including firmware, resident software, microcode, etc.) and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be wholly or partially implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing.

In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by hardware and/or computer readable program code. The computer readable program code may be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

In the following, like numbered elements in these figures are either similar elements or perform an equivalent function. Elements which have been discussed previously will not necessarily be discussed in later figures if the function is equivalent.

FIG. 1 shows one embodiment of efficiency of a silicon photovoltaic cell as a function of temperature in degrees Celsius. Shown in FIG. 1 is a dashed line 100 which shows the average efficiency as a function of temperature. The points labeled 102 are calculated efficiency. The points labeled 104 are measured efficiency. FIG. 1 illustrates that as the temperature of a silicon photovoltaic cell increases the efficiency decreases.

Figure 2:
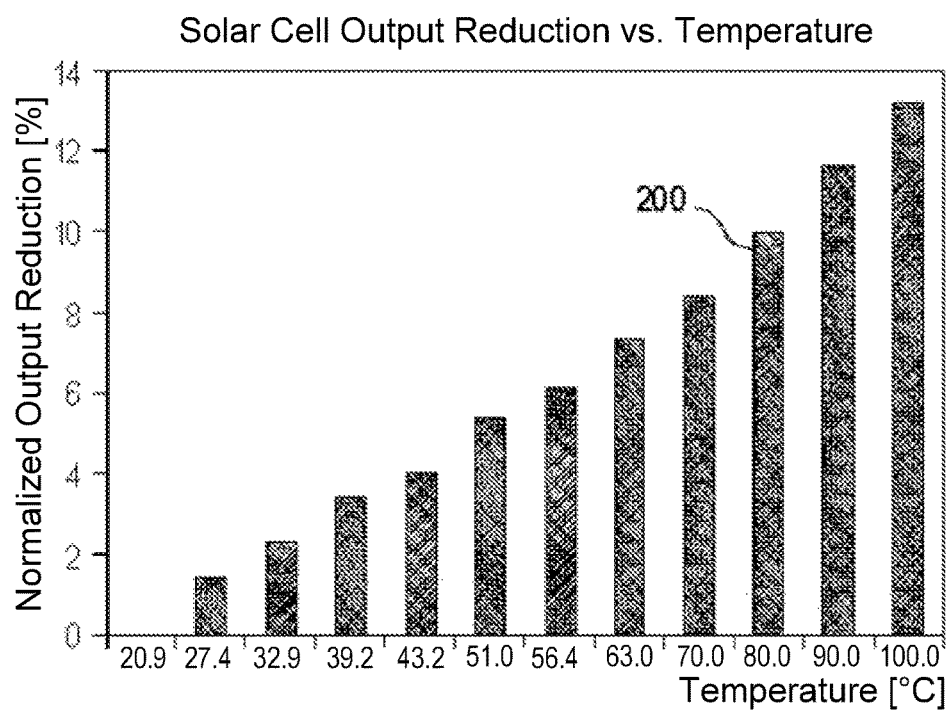
FIG. 2 illustrates the reduction in the output of electrical power by a silicon photovoltaic cell as a function of temperature.

FIG. 2 shows the reduction in the output of electrical power by a silicon photovoltaic cell as a function of temperature in degrees Celsius ("C"). The temperature reduction is normalized to 20.90 C. During operation it is not uncommon for a silicon photovoltaic cell to go above 80.0 C. At 80.0 C we see that at the bar labeled 200 the reduction in temperature is 10%. FIG. 2 illustrates that a substantial portion of the electrical energy can be lost due to the rise in temperature of a photovoltaic cell. Examining FIG. 1 and FIG. 2 it can be seen that it is beneficial if the predetermined temperature threshold where the infrared protection layer is switched into the second state before the photovoltaic module temperature reaches 70 degrees Celsius, because the efficiency of silicon photovoltaic cells drop drastically above this temperature.

Figure 3:
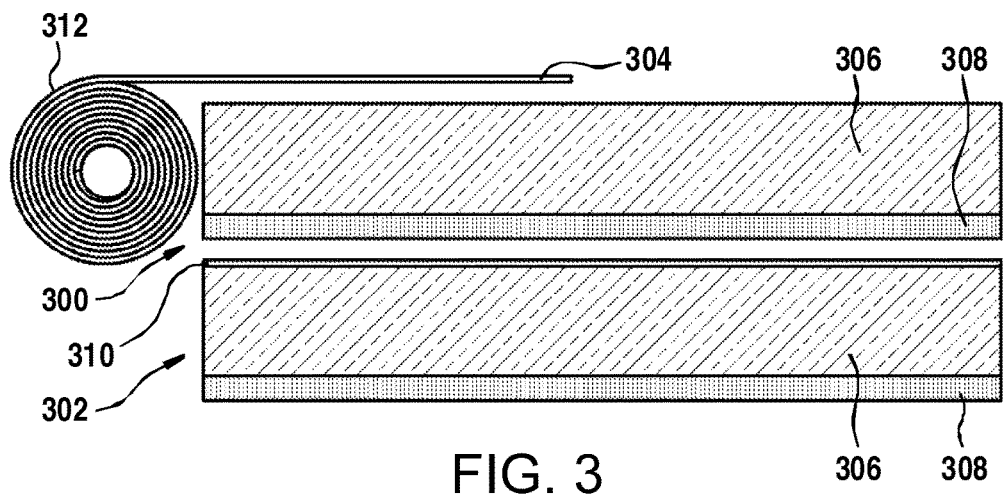
FIG. 3 shows two views of the same photovoltaic module according to an embodiment of the invention

FIG. 3 shows two views of the same photovoltaic module 300, 302. The photovoltaic module 300, 302 comprises a plurality of photovoltaic cells 308. On top of the plurality of photovoltaic cells 308 is a glass substrate 306. Above the glass substrate 306 is a foil 304, 310 which is able to be moved in front of the photovoltaic module 300, 302 or is able to be retracted into a position where the foil does not cover the photovoltaic module 300, 302. In illustration 300 the foil 304 is partially extended over the photovoltaic module 300. In view 302 the foil 310 extends and covers the photovoltaic module 302. In illustration 300 a portion of the foil 304 is spooled 312 to the left of the photovoltaic module 300. FIG. 3 is used to illustrate how a foil could be mechanically extended or retracted along the surface of a photovoltaic module. Guide rails or guard wires, which are not shown, may be used to guide the foil across the surface of the photovoltaic module 300, 302 also. The foil 304, 310 as shown in FIG. 3 may be a protective infrared foil or it may also be an infrared absorber. In another embodiment both the infrared absorber and the protective infrared foil could be implemented using this method for instance a protective infrared foil could be spooled on one side of the photovoltaic module and the infrared absorber could be spooled on the other side of the photovoltaic module.

Figure 4:
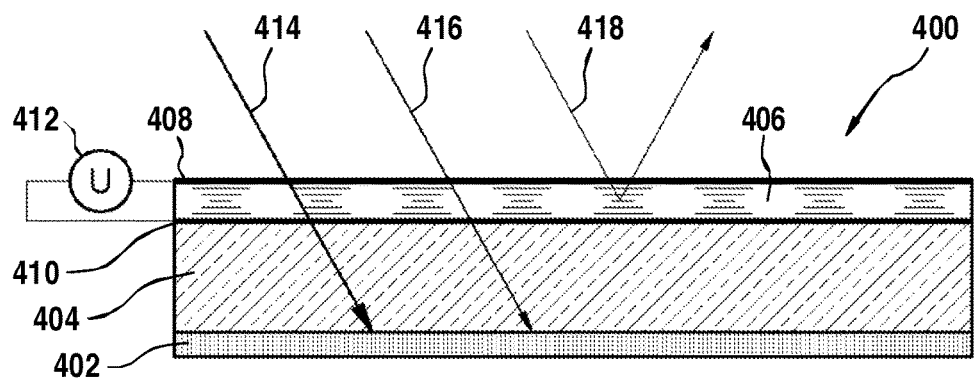
FIG. 4 illustrates an embodiment of the invention where reflective liquid crystals are used to controllably reflect light in the infrared wavelength range.

FIG. 4 illustrates an embodiment of the invention where reflective liquid crystals are used to controllably reflect light in the infrared wavelength range. In FIG. 4 a photovoltaic module 400 is shown. The photovoltaic module 400 comprises a plurality of photovoltaic cells 402. On top of the plurality of photovoltaic cells 402 is a glass substrate 404. On top of the glass substrate 404 is a polymer layer 406. The polymer layer 406 comprises cholesteric liquid crystals.

The polymer layer 406 has a top electrode 408 and a bottom electrode 410. When the top electrode 408 and the bottom electrode 410 are connected across a voltage supply 412 which supplies a voltage then the polymer layer 406 is able to reflect a substantial portion of light in the infrared wavelength 418. In FIG. 4 it is illustrated with rays that light of the visible wavelength 414 travels through the polymer layer and the glass substrate 406 to reach the plurality of photovoltaic cells 402. Similarly the ray labeled 416 illustrates that light in the ultraviolet wavelength travels through the polymer layer 406 and the glass substrate 404 to reach the plurality of photovoltaic cells 402. In the example shown in this figure the top electrode 408 and the bottom electrode 410 are connected across a voltage source 412. The crystals in the polymer layer 408 are therefore aligned and reflect light in the infrared wavelength. This is illustrated with the ray labeled 418 which shows a reflection in the polymer layer 406.

Figure 5:
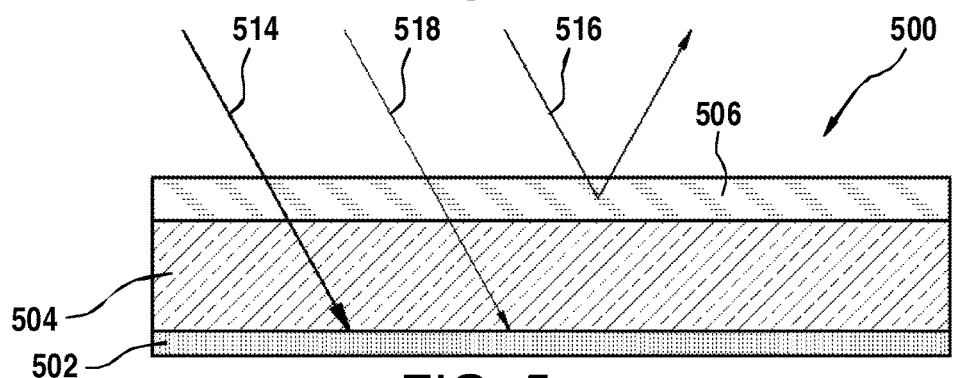
FIG. 5 illustrates the effect of an ultraviolet reflecting layer 506 on a photovoltaic module according to an embodiment of the invention.

FIG. 5 illustrates the effect of an ultraviolet reflecting layer 506 on a photovoltaic module 500. The photovoltaic module 500 shown in FIG. 5 comprises a plurality of photovoltaic cells 502. On top of the plurality of photovoltaic cells is a glass substrate 504. On top of the glass substrate 504 is an ultraviolet reflection layer 506. The ray labeled 514 illustrates that light in the visible wavelength travels through the ultraviolet reflection layer 506 and the glass substrate 504 to reach the plurality of photovoltaic cells 502. The ray labeled 518 illustrates that light in the infrared wavelength travels through the ultraviolet reflection layer 506 and the glass substrate 504 to reach the plurality of photovoltaic cells. The ray labeled 516 illustrates that light in the ultraviolet wavelength range is reflected by the ultraviolet reflection layer 506. The ultraviolet reflection layer 506 may be incorporated into the embodiments shown in FIGS. 3 and 4.

Figure 6:
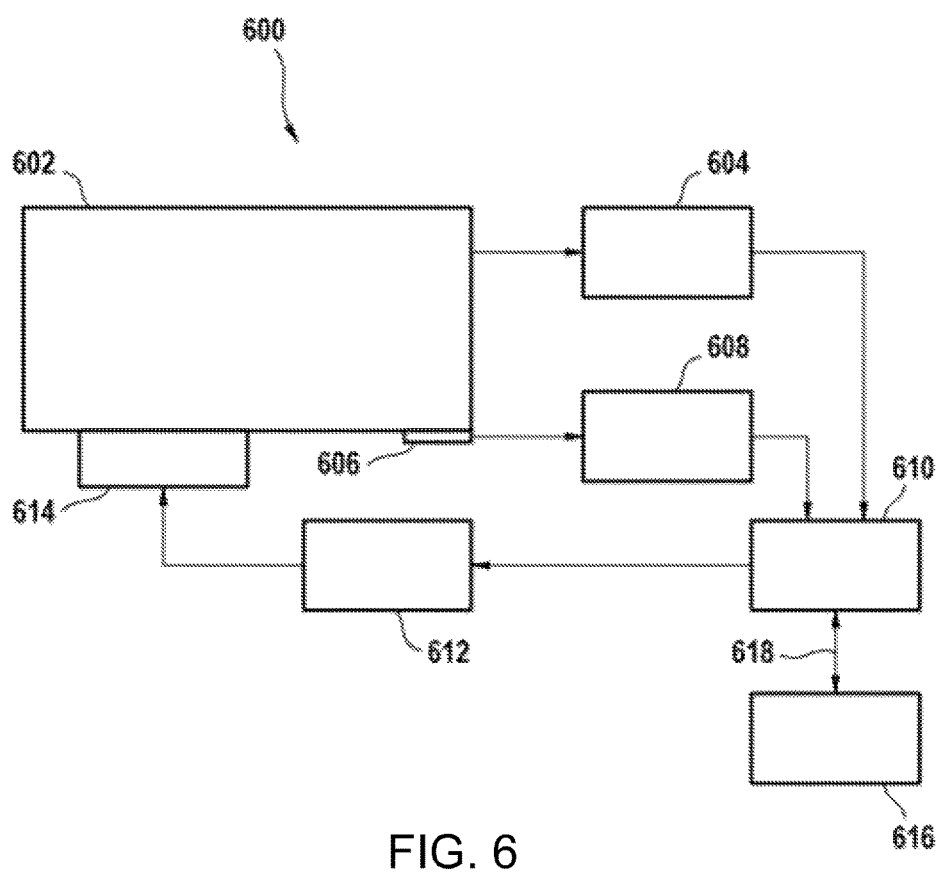
FIG. 6 illustrates a photovoltaic module system 600 according to an embodiment of the invention.

FIG. 6 illustrates a photovoltaic module system 600 according to an embodiment of the invention. The photovoltaic module system 600 comprises a photovoltaic module 602. The photovoltaic module 602 is connected to the power meter 604 of an inverter. The power meter 604 is connected to a controller 610. The photovoltaic module 602 comprises a temperature sensor 606 for measuring an effective temperature of the photovoltaic module 602. The temperature sensor 606 is connected to a temperature monitor 608. The temperature monitor 608 is connected to the controller 610 and the temperature monitor 608 provides the controller 610 with the temperature measurement from the temperature sensor 606. The controller 610 is able to use data from the temperature monitor 608 and the power meter 604 for controlling the temperature of the photovoltaic module and for scheduling maintenance of the photovoltaic module system 600. The controller 600 is able to send a signal to the protection switching means 612 to control if the controllable infrared protection layer 614 of the photovoltaic module 602 is in the first state or the second state.

In operation the controller 610 is able to use information from the power meter 604 and the temperature monitor 608 to infer information about the state of the photovoltaic module 602. In addition to being able to control the controllable infrared protection layer 614 the controller 610 is also able to control an infrared absorber if it is included in the photovoltaic module system 600. If for instance the photovoltaic module 602 needs to be cleaned or is scheduled to be cleaned the controller 610 may also communicate with an external maintenance system 616. The maintenance system 616 may be a computer or information system of a company which manages the photovoltaic module system 600 or it may also be a service company. The controller 610 communicates with the maintenance system 616 via a network link 618. The network link 618 may be a communication link such as an internet connection, a mobile or cellular telephone link, an Ethernet connection, or other computer network link. The network link 618 also allows the remote monitoring of the performance of the photovoltaic module system 600.

The temperature sensor 606 measures the photovoltaic module 602 temperature. The infrared and/or ultraviolet blocking is activated in case a predetermined temperature threshold is reached. The sensor can be embedded into the encapsulated photovoltaic module 602, on the photovoltaic module surface 602, between photovoltaic cell gaps. It is beneficial if algorithm ensures that the photovoltaic module 602 doesn't run into critical temperature range. This means, that the predetermined temperature threshold is well before this limit.

The output performance or production of electricity may be monitored over time. By applying trend rules, degradation of the output performance may be detected. Module as well as cell performance is monitored and may enable appropriate maintenance if required. If the performance of the photovoltaic module decreases below a predetermined level, then maintenance is initiated. For example, a healing anneal through infrared absorber foil or a heating system could be initiated.

Figure 7:
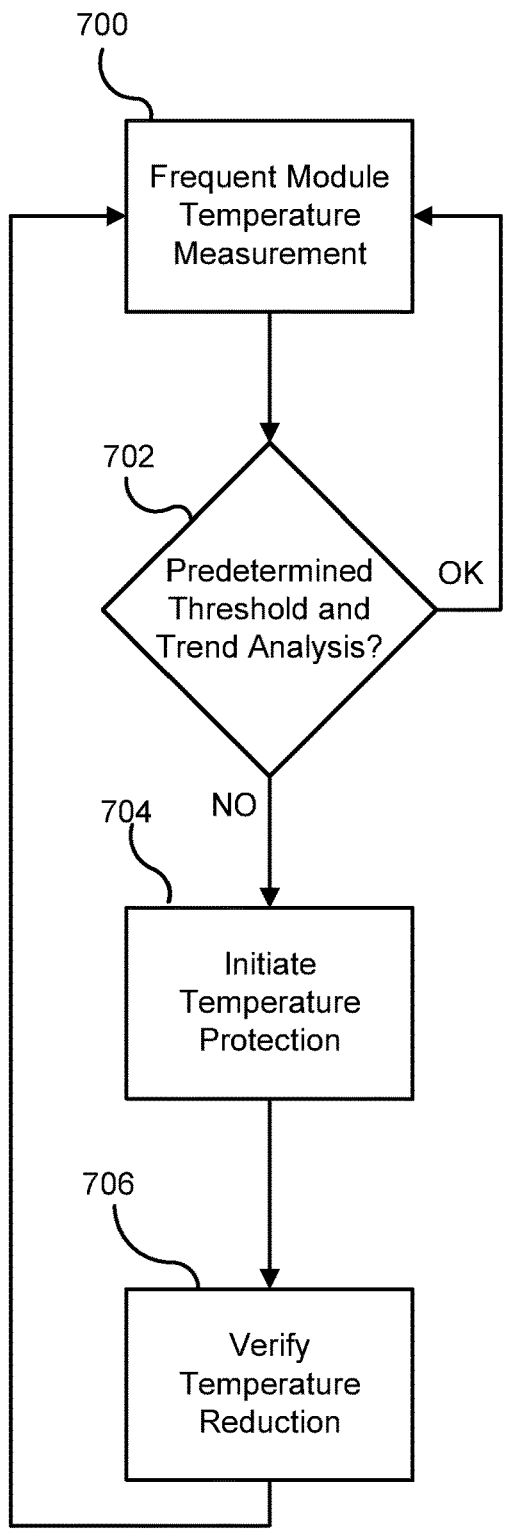
FIG. 7 illustrates an embodiment of a method according to the invention.

FIG. 7 shows an embodiment of a method according to the invention. In step 700 the module temperature is measured frequently. In step 702 the temperature of the module is compared to a predetermined threshold and also a trend analysis of the temperature is analyzed in step 702. If the temperature is below the predetermined threshold and the trend analysis indicates that the module is not heating then no action is taken and the method returns to step 700 where the module temperature is measured. The trend analysis is performed to prevent the photovoltaic module from rapidly switching between the first state and the second state. This may be accomplished by looking at the trend or the direction and change of the temperature measurement or it may also be used by using an upper and lower threshold similar to one that would be used in electronics for a Schmidt trigger. If however the temperature is above the predetermined threshold and the trend analysis indicates that the module is still heating temperature protection is initiated in step 704. In step 706 temperature reduction is verified by returning to step 700 and frequently monitoring the temperature of the photovoltaic module.

Figure 8:
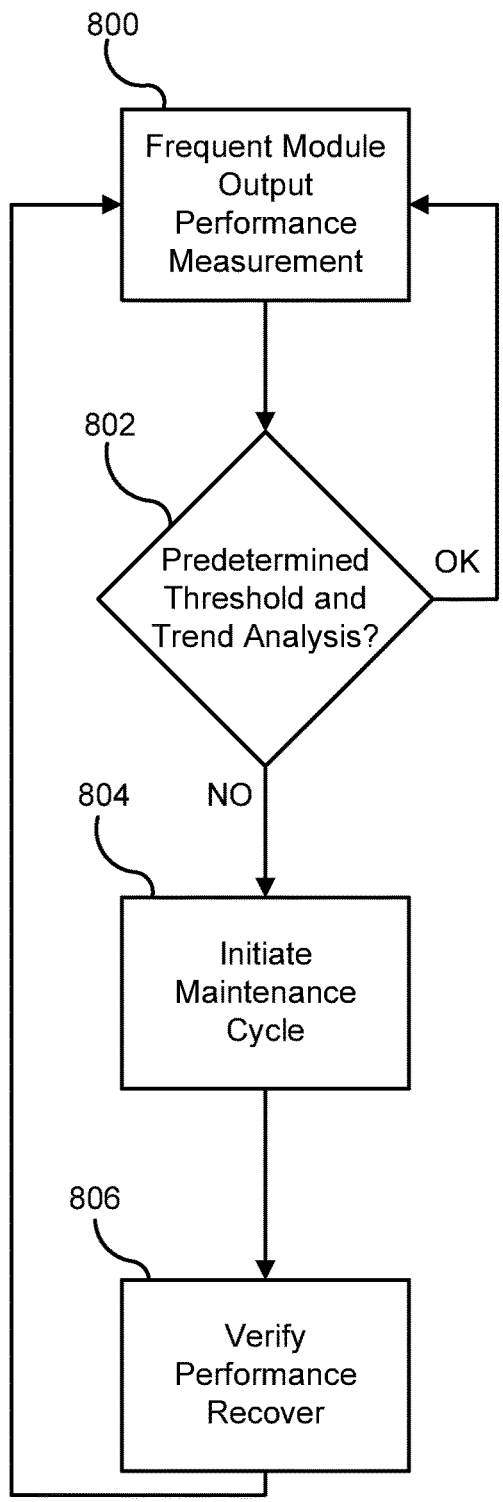
FIG. 8 illustrates a further embodiment of a method according to the invention.

FIG. 8 illustrates a further embodiment of a method according to the invention. In FIG. 8 the performance of the photovoltaic module is measured. In step 802 the performance and temperature are compared to the predetermined temperature threshold and the trend analysis of the performance in step 802. If the predetermined temperature threshold is not exceeded and/or the trend analysis does not indicate excessive heating, then the method returns to step 800 where the performance is monitored on a regular basis. If the trend analysis indicates that the performance as a function of temperature is decreasing then in step 804 a maintenance cycle is initiated. After the maintenance cycle has been initiated in step 804 the performance recovery is verified in step 806. Then the method returns to step 800 again.

Figure 9:
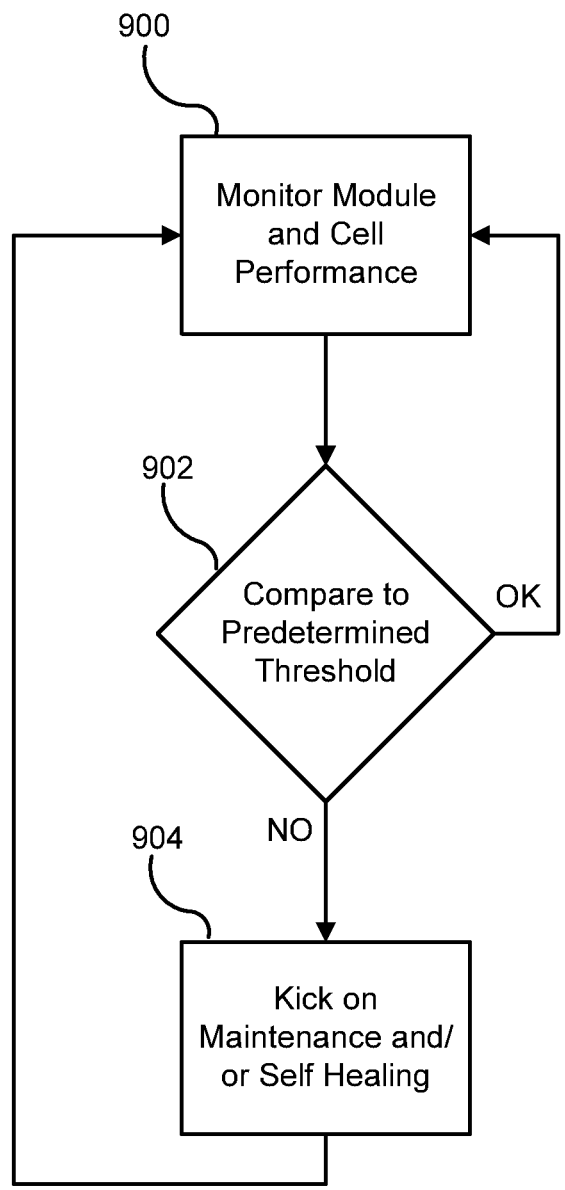
FIG. 9 illustrates a further embodiment of a method according to the invention.

FIG. 9 shows another embodiment of a method according to the invention. In step 900 the module performance and the individual photovoltaic cell performance are monitored. In step 902 the temperature of the photovoltaic module is compared to the performance level of the photovoltaic module and the individual photovoltaic cells. If this is within a predetermined threshold then the method returns to step 900. If this is below a predetermined threshold then maintenance and/or self-healing of the photovoltaic module is performed in step 904. After the maintenance and/or self-healing is performed then the method returns back to step 900 again.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

LIST OF REFERENCE NUMERALS 100 dashed line
102 calculated efficiency
200 bar indicating efficiency at 80 degrees Celsius
300 photovoltaic module
302 photovoltaic module
304 foil
306 glass substrate
308 plurality of photovoltaic cells
310 foil
312 spooled foil
400 photovoltaic module
402 plurality of photovoltaic cells
404 glass substrate
406 polymer layer
408 top electrode
410 bottom electrode
412 voltage supply
414 visible wavelength
416 ultraviolet wavelength
418 infrared wavelength
500 photovoltaic module
502 plurality of photovoltaic cells
504 glass substrate
506 ultraviolet reflection layer
514 visible wavelength
516 ultraviolet wavelength
518 infrared wavelength
600 photovoltaic module system
602 photovoltaic module
604 power meter
606 temperature sensor
608 temperature monitor
610 controller
612 protection switching means
614 controllable infrared protection layer
616 maintenance system
618 network link

What is claimed is:

1. A photovoltaic module comprising:
a plurality of photovoltaic cells, wherein the photovoltaic module has a front side and a back side, the plurality of photovoltaic cells producing electricity when the front side of the photovoltaic module is illuminated;
a glass substrate coupled to the front side of the photovoltaic module;
a controllable infrared protection layer for reducing the infrared radiation absorbed by the photovoltaic module, wherein the controllable infrared protection layer has a first state and a second state, wherein when the infrared protection layer is in the first state the transmission of infrared radiation to the photovoltaic cells is higher than when the infrared protection layer is in the second state, the controllable infrared protection layer comprising a polymer layer with reflective liquid crystals, the polymer layer comprising a top electrode and a bottom electrode, wherein one of the top electrode and the bottom electrode is adjacent to the glass substrate, wherein the polymer layer is in the first state when the top electrode and the bottom electrode are at the same potential and the polymer layer is in the second state when a switching voltage is applied across the top electrode and the bottom electrode, wherein light of the visible wavelength travels through the polymer layer and the glass substrate to reach the plurality of photovoltaic cells in the first state and in the second state;
a protection switching means for switching the controllable infrared protection layer between the first state and the second state, the protection switching means comprising a voltage supply adapted for applying a switching voltage to the top electrode and the bottom electrode.

2. The photovoltaic module of claim 1, wherein the polymer layer with reflective liquid crystals comprises cholesteric liquid crystals.

3. The photovoltaic module of claim 1, wherein the controllable infrared protection layer comprises an ultraviolet reflector, the ultraviolet reflector reflecting ultraviolet radiation in the first state and the second state.

4. The photovoltaic module of claim 3, wherein the ultraviolet reflector comprises one or more of acetone (AcAc) chelated silane, 3-glycidoxypropyl-trimethoxysilane (GPTMS) modified nano-titania sol, methacrylate functionalized silane, and nanoscaled boehmite particles.

5. The photovoltaic module of claim 1, wherein the photovoltaic module further comprise a temperature sensor, the temperature sensor measuring a module temperature representative of the temperature of the plurality of photovoltaic cells, and wherein the protection switching means is adapted for switching the controllable infrared protection layer from the first state to the second state when the module temperature exceeds a predetermined temperature threshold.

6. The photovoltaic module of claim 1, wherein the protection switching means comprises a thermal expansion element, wherein the temperature of the thermal expansion element switches the controllable infrared protection layer between the first state and the second state.

7. A photovoltaic module system, the photovoltaic module system comprising:
  a photovoltaic module comprising:
    a plurality of photovoltaic cells, wherein the photovoltaic module has a front side and a back side, the plurality of photovoltaic cells producing electricity when the front side of the photovoltaic module is illuminated;
    a glass substrate coupled to the front side of the photovoltaic module;
    a controllable infrared protection layer for reducing the infrared radiation absorbed by the photovoltaic module, wherein the controllable infrared protection layer has a first state and a second state, wherein when the infrared protection layer is in the first state the transmission of infrared radiation to the photovoltaic cells is higher than when the infrared protection layer is in the second state, the controllable infrared protection layer comprising a polymer layer with reflective liquid crystals, the polymer layer comprising a top electrode and a bottom electrode, wherein one of the top electrode and the bottom electrode is adjacent to the glass substrate, wherein the polymer layer is in the first state when the top electrode and the bottom electrode are at the same potential and the polymer layer is in the second state when a switching voltage is applied across the top electrode and the bottom electrode, wherein light of the visible wavelength travels through the polymer layer and the glass substrate to reach the plurality of photovoltaic cells in the first state and in the second state; and
    a protection switching means for switching the controllable infrared protection layer between the first state and the second state, the protection switching means comprising a voltage supply adapted for applying a switching voltage to the top electrode and the bottom electrode;
  a temperature sensor for measuring a photovoltaic module temperature representative of the temperature of the plurality of photovoltaic cells; and
  a control system adapted for:
    receiving the photovoltaic module temperature measurement;
    signaling the protection switching means when the photovoltaic module temperature measurement exceeds a predetermined threshold; and
    switching the controllable infrared protection layer from the first state to the second state in response to receiving a signal indicating that the photovoltaic module temperature measurement exceeds a predetermined threshold.

8. A computer program product for execution by a control system for controlling a photovoltaic module system, the photovoltaic module system comprising
  a photovoltaic module comprising:
    a plurality of photovoltaic cells, wherein the photovoltaic module has a front side and a back side, the plurality of photovoltaic cells producing electricity when the front side of the photovoltaic module is illuminated;
    a glass substrate coupled to the front side of the photovoltaic module;
    a controllable infrared protection layer for reducing the infrared radiation absorbed by the photovoltaic module, wherein the controllable infrared protection layer has a first state and a second state, wherein when the infrared protection layer is in the first state the transmission of infrared radiation to the photovoltaic cells is higher than when the infrared protection layer is in the second state, the controllable infrared protection layer comprising a polymer layer with reflective liquid crystals, the polymer layer comprising a top electrode and a bottom electrode, wherein one of the top electrode and the bottom electrode is adjacent to the glass substrate, wherein the polymer layer is in the first state when the top electrode and the bottom electrode are at the same potential and the polymer layer is in the second state when a switching voltage is applied across the top electrode and the bottom electrode, wherein light of the visible wavelength travels through the polymer layer and the glass substrate to reach the plurality of photovoltaic cells in the first state and in the second state; and
    a protection switching means for switching the controllable infrared protection layer between the first state and the second state; and
  a temperature sensor for measuring a photovoltaic module temperature representative of the temperature of the plurality of photovoltaic cells,
the computer program product comprising machine executable instructions for performing the steps of:
  monitoring the photovoltaic module temperature;
  determining if the photovoltaic module temperature measurement exceeds a predetermined threshold;
  signaling the protection switching means when the photovoltaic module temperature measurement exceeds a predetermined temperature threshold;
  monitoring the production of electricity by the photovoltaic module;
  calculating a maintenance schedule based on the measurement of the production of electricity and of temperature to determine performance of the photovoltaic module; and
  sending a message that maintenance is requested in response to determining that performance of the photovoltaic module has decreased below a predetermined level.

9. A method for operating a photovoltaic module system, wherein the method comprising:
  monitoring temperature of a photovoltaic module, the photovoltaic module comprising
    a plurality of photovoltaic cells, wherein the photovoltaic module has a front side and a back side, the plurality of photovoltaic cells producing electricity when the front side of the photovoltaic module is illuminated;

a glass substrate coupled to the front side of the photovoltaic module;

a controllable infrared protection layer for reducing the infrared radiation absorbed by the photovoltaic module, wherein the controllable infrared protection layer has a first state and a second state, wherein when the infrared protection layer is in the first state the transmission of infrared radiation to the photovoltaic cells is higher than when the infrared protection layer is in the second state, the controllable infrared protection layer comprising a polymer layer with reflective liquid crystals, the polymer layer comprising a top electrode and a bottom electrode, wherein one of the top electrode and the bottom electrode is adjacent to the glass substrate, wherein the polymer layer is in the first state when the top electrode and the bottom electrode are at the same potential and the polymer layer is in the second state when a switching voltage is applied across the top electrode and the bottom electrode, wherein light of the visible wavelength travels through the polymer layer and the glass substrate to reach the plurality of photovoltaic cells in the first state and in the second state; and a protection switching means for switching the controllable infrared protection layer between the first state and the second state, the protection switching means comprising a voltage supply adapted for applying a switching voltage to the top electrode and the bottom electrode;

determining if the photovoltaic module temperature measurement exceeds a predetermined temperature threshold; and signaling the protection switching means when the photovoltaic module temperature measurement exceeds the predetermined temperature threshold;

monitoring the production of electricity by the photovoltaic module;

calculating a maintenance schedule based on the measurement of the production of electricity and of temperature to determine performance of the photovoltaic module; and sending a message that maintenance is requested in response to determining that performance of the photovoltaic module has decreased below a predetermined level.

* * * * *